United States Patent [19]

Quintana

[11] 4,004,957
[45] Jan. 25, 1977

[54] METHOD FOR ETCHING SILICON

[75] Inventor: Leo J. Quintana, Orange, Calif.

[73] Assignee: Rockwell International Corporation, El Segundo, Calif.

[22] Filed: June 14, 1976

[21] Appl. No.: 695,686

Related U.S. Application Data

[62] Division of Ser. No. 599,910, July 28, 1975.

[52] U.S. Cl. .............................. 156/643; 156/659; 252/79.3
[51] Int. Cl.² .......................................... H01L 7/50
[58] Field of Search ............ 156/8, 11, 17; 96/36.2, 96/38.3, 38.4; 252/79.3

[56] References Cited

UNITED STATES PATENTS

| 3,106,499 | 10/1963 | Kendall .............................. 156/21 |
| 3,592,773 | 7/1971 | Muller .............................. 252/79.3 |
| 3,811,974 | 5/1974 | Squillace et al. .................. 252/79.3 |

*Primary Examiner*—William A. Powell
*Attorney, Agent, or Firm*—H. Fredrick Hamann; G. Donald Weber, Jr.; Robert Ochis

[57] ABSTRACT

A solution comprising fluoroboric acid, nitric acid and ammonium fluoroborate is an isotropic etchant for monocrystalline and polycrystalline silicon which can be used to etch patterns which are delineated by etching masks formed of positive photoresists, thermally grown silicon oxide or deposited silox.

6 Claims, 3 Drawing Figures

METHOD FOR ETCHING SILICON

This is a division of application Ser. No. 599,910, filed July 28, 1975.

BACKGROUND OF THE INVENTION

1. Field of the Invention

The invention relates to the field of etchants for silicon.

2. Prior Art

Prior art etching solutions for silicon are of essentially two types. The first type are basic solutions such as sodium hydroxide or potassium hydroxide. These basic solutions rapidly attack photoresist material, thus preventing use of ethcing masks formed of photoresists. However, these solutions attack silicon oxide much more slowly than they attack silicon. Consequently, it has become standard practice in the industry to utilize a silicon oxide etching mask to define and protect the area of the silicon which is not to be etched when these basic etching solutions are utilized. Unfortunately, these basic solutions when utilized with a silicon oxide mask yield an undesirable undercut within the "protected" silicon in the vicinity of the oxide mask. This undercut can be detrimental to the quality of integrated circuits produced using this process because the undercut tends to result in voids in oxide or metal deposited over the etched silicon.

A further disadvantage of hydroxide etching solutions is the fact that these solutions etch $N^+$ monocrystalline silicon approximately 1.5 times faster than they etch $P^+$ monocrystalline silicon. As a result of this difference in etch rate, a single immersion in the etching bath will not etch $N^+$ and $P^+$ silicon to the same depth. Further, these etching systems are anisotropic and consequently etch monocrystalline silicon faster parallel to some crystallographic axes than they etch monocrystalline silicon parallel to other crystallographic axes.

The second type of prior art silicon etching solutions are acid solutions containing nitric acid, hydrofluoric acid and acetic acid. These etchants rapidly attack photoresist materials and result in an etch having a profile which includes an undesirable undercut within the "protected" silicon. Since these etchants attack photoresists, it is necessary to utilize an etching mask such as thermally grown silicon oxide or deposited silox or some other masking material which is more resistant to the etchant than silicon is.

The requirement that silicon oxide rasks be utilized when etching silicon increases process time and costs because the silicon wafer to be etched must first be introduced into a furnace for the purpose of growing or depositing the silicon oxide masking material prior to its definition by a photoresist and etching technique.

SUMMARY OF THE INVENTION

The present invention overcomes the disadvantages of the prior art silicon etching solutions by providing an etching solution comprising fluoroboric acid, nitric acid and ammonium fluoroborate. Silicon to be etched in this etchant can have the pattern to be etched delineated by positive photoresists, without the necessity of using other masking materials. Further, this etching solution yields a profile which is relatively free of undercutting.

DETAILED DESCRIPTION OF THE PREFERRED EMBODIMENT

Figure 1:
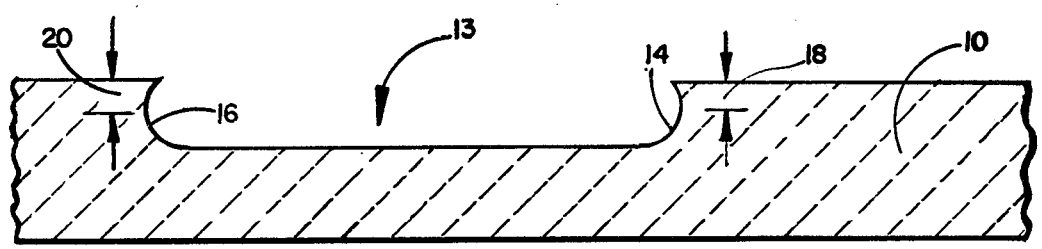
FIG. 1 is illustrative of the type of profile produced by the prior art silicon etching solutions.

The type of profile produced when silicon is etched using prior art etchants is illustrated in FIG. 1 where a wafer 10 of silicon has been etched to produce a groove 13 having sides 14 and 16. As a result of the use of prior art etchants, the upper portion 18 of edge 14 is undercut as is the upper portion 20 of edge 16.

An etchant in accordance with the present invention comprises fluoroboric acid ($HBF_4$) also known as fluoboric acid, nitric acid ($HNO_3$) and ammonium fluoroborate ($NH_4BF_4$) also known as ammonium fluoborate. The nitric acid and fluoroboric acid together serve to etch the silicon while the ammonium fluoroborate is a stabilizer which maintains the concentration of the fluoride ion in the solution in order to increase the useful life of the solution. This etchant etches both $N^+$ and $P^+$ monocrystalline silicon at approximately the same rate such that $P^+$ and $N^+$ silicon are etched to the same depth. This etchant is isotropic and therefore etches silicon at a constant rate independent of orientation. As a result of the isotropic nature of the etchant, the etchant produces a positive slope in the profile of etched monocrystalline silicon independent of orientation. The positive slope to the etch profile assures that metallization or other materials can be deposited over the etched silicon material in a manner which substantially eliminates voids which can trap air or processing solutions.

Figure 2:
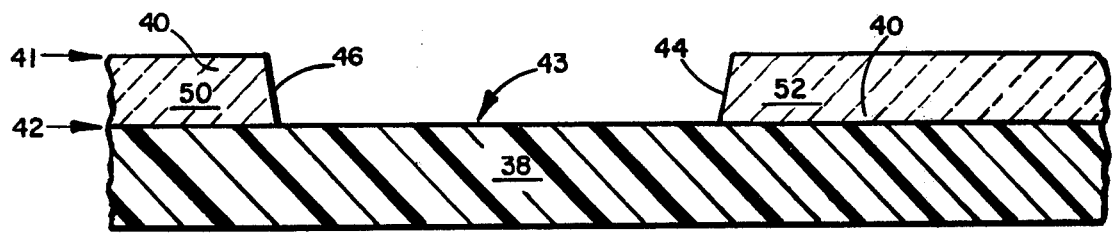
FIG. 2 is illustrative of the type of profile obtained by the etchant of the present invention when etching monocrystalline silicon.

The positive slope of the etch profile produced by the etchant of this invention is illustrated in FIG. 2 where a monocrystalline silicon layer 40 which is epitaxially disposed on a sapphire substrate 38 has been etched to produce a groove 43 in silicon layer 40 which separates the silicon film into a plurality of separate islands 50 and 52. The etch profile at edges 44 and 46 of groove 43 has a positive slope (i.e. the groove 42 gets progressively narrower from the top 41 of silicon layer 40 to the bottom 42 of layer 40.

The etchant of this invention attacks positive photoresists of which Shipley AZ135OJ is one example slowly enough that positive photoresists can be used without special precautions to delineate etch patterns on layers of silicon which are to be etched to a depth of 10,000 A or more. Consequently, the time and expense necessary to produce a silicon oxide mask in order to etch silicon material is no longer necessary. However, where other considerations make it desirable, the etching solution of this invention may be utilized with thermally grown silicon oxide or deposited silox etching masks in the same manner as prior art silicon etching solutions are utilized. Use of this solution minimizes undesirable undercutting during the etching process.

An etchant in accordance with this invention which is of a given composition will etch polycrystalline silicon at a substantially faster rate than it will etch monocrystalline silicon. For etching monocrystalline silicon it is desirable that the etching solution have a composition comprising 80 – 20% by volume concentrated nitric acid (69%), 20 – 80% by volume fluoroboric acid (48%) and 0.5 – 2.0 grams per liter ammonium fluoroborate and preferably comprises approximately 80% $HNO_3$, 20% $HBF_4$ and 0.5 – 1.0 grams per liter $NH_4BF_4$. This preferred composition etches monocrystalline silicon at a rate of 900 to 1100 Å per minute at room temperature.

For etching polycrystalline silicon, it is desirable that the etching solution have a composition comprising 80 – 95% by volume concentrated nitric acid, 5 – 20% by volume fluoroboric acid (48%) and approximately 0.5 gram per liter ammonium fluoroborate and preferably comprises 90% $HNO_3$, 10% $HBF_4$ and about 0.5 grams per liter $NH_4BF_4$. This preferred composition etches polycrystalline silicon at a rate of 500 – 800 Å per minute at room temperature.

The above specified concentration ranges are desirable because they have etching rates which are slow enough to allow accurate process control, without requiring excessive etching time. Where a faster or slower etching rate is desired, the solution concentration can be varied from the preferred concentration range.

EXAMPLE 1

A 7000 Å thick layer of monocrystalline silicon disposed on a sapphire substrate was masked using Shipley AZ135OJ positive photoresist. First, a layer of Shipley AZ135OJ photoresist was applied over the polycrystalline silicon by techniques which are well-known in the art. Thereafter, the photoresist material was exposed, developed and postbaked in accordance with the techniques which are well known in the art. Thereafter, the silicon on sapphire wafer was immersed in an etching solution in accordance with the invention comprising approximately 80% concentrated nitric acid, approximately 20% fluoroboric acid (48%) and approximately 0.5 grams per liter ammonium fluoroborate for a period of 6–8 minutes. At the end of this period, the wafer was removed from the etching solution and rinsed in deionized water. The photoresist material remaining on the silicon was then removed and processing of the wafer proceeded in the same fashion as it would have proceeded after removal of a silicon oxide or silox etching mask following the etch of silicon. As a result of the etching procedure, the silicon material was completely removed in the areas in which it was not protected by photoresist and was unaffected in the areas same where it was protected by photoresist. The edge of the silicon island which remained after the etching step had a slope similar to that illustrated at 44 and 46 in FIG. 2. The angle formed by edges 44 and 46 and the bottom 42 of the silicon layer was in the neighborhood of 80°. No undesirable undercutting within the protected silicon resulted from this etch, although normal etch back beneath the etching mask resulted from the anisotropic nature of the etching solution.

EXAMPLE 2

An etch of bulk monocrystalline silicon which was performed in the manner of Example 1 yielded a profile which was substantially identical to that produced in Example 1.

EXAMPLE 3

Figure 3:
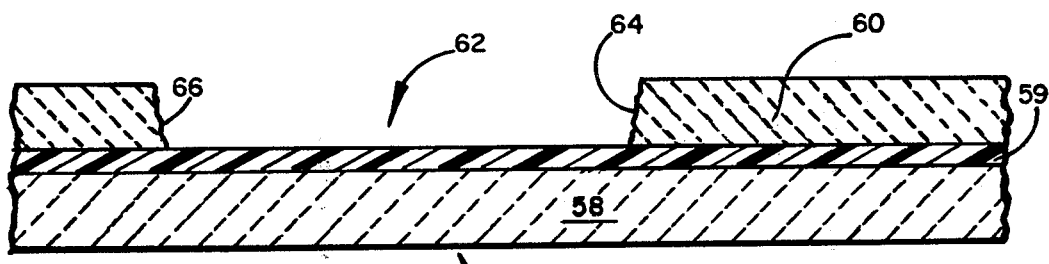
FIG. 3 is illustrative of the type of profile achieved by the etchant of the present invention when utilized to etch polycrystalline silicon.

A wafer 56 having a 5000 Å thick layer 60 of polycrystalline silicon disposed on a dielectric 59 overlying silicon 58 was etched to remove the polycrystalline silicon in some areas such as groove 62. First, a layer of Shipley AZ135OJ photoresist was applied over the polycrystalline silicon by techniques which are well-known in the art. Thereafter, the photoresist material was exposed, developed and postbaked in accordance with the techniques which are well-known in the art. The wafer was then immersed in an etching solution containing approximately 90% concentrated nitric acid by volume, approximately 10% fluoroboric acid (48%) by volume and approximately 0.5 gram per liter ammonium fluoroborate. After a period of 6–8 minutes the wafer was removed from the etching solution, rinsed in deionized water and stripped of the remaining photoresist. As a result of this etching process, the polycrystalline silicon was completely removed in those areas where it was not protected by photoresist and was unaffected in those areas where it was protected by photoresist (except for normal etch back). The polycrystalline silicon remaining on the wafer had an edge profile such as that illustrated at 64 and 66 in FIG. 3. This profile had a positive slope in which there was no significant undesirable undercutting. However, the angle of the profile varied from location to location as a result of the polycrystalline nature of the silicon 60.

EXAMPLES 4, 5 and 6

Each of Examples 1, 2 and 3 was repeated using a thermally grown silicon oxide layer as an etching mask. The silicon oxide had the desired etching pattern delineated therein in a conventional manner. The etch was then performed in the same manner as specified in Examples 1, 2 and 3. These etches produced results which are similar to those obtained in Examples 1, 2 and 3.

EXAMPLES 7, 8 and 9

Examples 4, 5 and 6 were repeated, but using deposited silox etching masks rather than thermally grown silicon oxide mask. The results obtained were the same as in Examples 4, 5 and 6.

Thus, an etching solution which isotropically etches silicon at a substantially uniform rate independent of conductivity type of the silicon has been described which is suitable for use with masks comprised of positive photoresists or thermally grown silicon oxide or deposited silox.

Although the preferred composition of the etchant of this invention has been specified, it will be understood that other ions may be included in the etching solution so long as they do not result in destruction of the mask utilized to define the areas of the silicon which are to be etched and do not detrimentally change the etching characteristics of the solution. Consequently, those skilled in the art may be able to vary the composition of this etchant without departing from the scope of the invention. However, the preferred embodiment and the examples are illustrative only and not limitive. Consequently, the protection afforded this invention is limited only by the appended claims.

What is claimed is:
1. A method of selectively etching silicon comprising the steps of:

depositing a layer of positive photoresist material upon said silicon;

defining in said photoresist material the portions of the silicon which are to be protected from etching; and exposing the unprotected portions of the silicon to an etchant for a period of time which is sufficient to remove a desired quantity of silicon, said etchant comprising between 20 and 95 percent by volume nitric acid, between 80 and 5 percent by volume fluoboric acid and up to about 2 grams of ammonium fluoborate per liter of the etchant.

2. The method recited in claim 1 wherein said defining step comprises:

exposing said photoresist to actinic light in the pattern of the silicon which is to be etched;

developing said photoresist; and postbaking said photoresist.

3. The method recited in claim 1 wherein said silicon is polycrystalline and said nitric acid comprises between 20 and 80 percent by volume of the etchant, said fluoboric acid comprises between 80 and 20 percent by volume of the etchant and said ammonium fluoborate comprises between 1 and 2 grams per liter of the etchant.

4. The method recited in claim 3 wherein said nitric acid comprises about 75 percent by volume of said etchant and said fluoboric acid comprises about 25 percent by volume of said etchant.

5. The method recited in claim 1 wherein said silicon is monocrystalline and said nitric acid comprises between 80 and 95 percent by volume of said etchant, said fluoboric acid comprises between 20 and 5 percent by volume of said etchant and said ammonium fluoborate comprises about 0.5 grams per liter of said etchant.

6. The method recited in claim 5 wherein said nitric acid comprises about 9 percent by volume of said etchant and said fluoboric acid comprises about 10 percent by volume of said etchant.

* * * * *